United States Patent [19]

Samaha

[11] Patent Number: 5,787,021
[45] Date of Patent: Jul. 28, 1998

[54] INFORMATION SYSTEM FOR PRODUCTION CONTROL

[75] Inventor: Moustafa Samaha, Freiburg, Germany

[73] Assignee: Detusche ITT Industries GmbH, Freiburg, Germany

[21] Appl. No.: 574,394

[22] Filed: Dec. 18, 1995

[30] Foreign Application Priority Data

Dec. 28, 1994 [DE] Germany ............... 44 46 966.7

[51] Int. Cl.$^6$ ........................................ G06F 19/00
[52] U.S. Cl. ............... 364/552; 364/468.16; 364/468.28
[58] Field of Search ........................... 364/552, 554, 364/551.01, 551.02, 580, 468.28, 468.15, 468.16, 468.17

[56] References Cited

U.S. PATENT DOCUMENTS

| | | | |
|---|---|---|---|
| 4,593,369 | 6/1986 | Thompson | 364/552 |
| 4,599,699 | 7/1986 | Stewart-Cox et al. | 364/552 |
| 4,819,176 | 4/1989 | Ahmed et al. | 364/468.16 |
| 4,858,102 | 8/1989 | Lovrenich | 364/468.15 |
| 4,901,242 | 2/1990 | Kotan | 364/468.28 |
| 4,939,665 | 7/1990 | Gold et al. | 364/552 |
| 5,008,842 | 4/1991 | Nagai et al. | 364/468.15 |
| 5,086,397 | 2/1992 | Schuster et al. | 364/468.17 |
| 5,134,574 | 7/1992 | Beaverstock et al. | 364/552 |
| 5,161,110 | 11/1992 | Dorchak | 364/468.15 |
| 5,166,874 | 11/1992 | Nomaru et al. | 364/468.16 |
| 5,245,704 | 9/1993 | Weber et al. | 395/200.16 |
| 5,284,164 | 2/1994 | Andrews et al. | 364/552 |
| 5,311,759 | 5/1994 | Mangrulkar et al. | 364/552 |
| 5,339,257 | 8/1994 | Layden et al. | 364/552 |
| 5,355,320 | 10/1994 | Erjavic et al. | 364/488 |
| 5,408,405 | 4/1995 | Mozumder et al. | 364/468.28 |
| 5,440,478 | 8/1995 | Fisher et al. | 364/468.16 |
| 5,442,562 | 8/1995 | Hopkins et al. | 364/468.15 |
| 5,497,331 | 3/1996 | Iriki et al. | 364/468.28 |
| 5,499,196 | 3/1996 | Pacheco | 364/552 |

FOREIGN PATENT DOCUMENTS

WO9325945 12/1993 WIPO.

OTHER PUBLICATIONS

Hodges et al., "Computer Integrated Manufacturing", IEEE/CHMT 1989 IEMT Symposium, pp. 1–3.

Khera et al., "Increasing Profitability and Improving Semiconductor Manufacturing Throughput Using Expert Systems", IEEE Trans. on Engineering Management, vol. 41, No. 2, May 1994, pp. 143–151.

Ura et al., "Remote Maintenance Function for Distributed Control System", *Advances in Instrumentation and Control*, Instrument Society of America 1993 Conf., vol. 48 Part 3, pp. 1557–1564.

"On–Line Production Control and Yield Analysis with Firms" by Moustafa Samaha dated Apr., 1995, Teradine Users Group Thirteenth Annual Mtg.

*Primary Examiner*—Ellis B. Ramirez
*Assistant Examiner*—Eric W. Stamber
*Attorney, Agent, or Firm*—Plevy & Associates

[57] ABSTRACT

An information system for production control wherein measured data from many test facilities is controlled, stored, and, if necessary, processed in a central data base. Via two-way data links, various data users can access the stored data and use this data for their own purposes. Thus it is possible, for example, to retrieve production figures of individual products or entire product ranges, complied statistics, calculate costs, determine yields, and the like. Access by the individual data users to the data base takes place via a terminal or a personal computer, with which nearly every work place is equipped and which are electronically interconnected via a data network for the exchange of data.

18 Claims, 1 Drawing Sheet

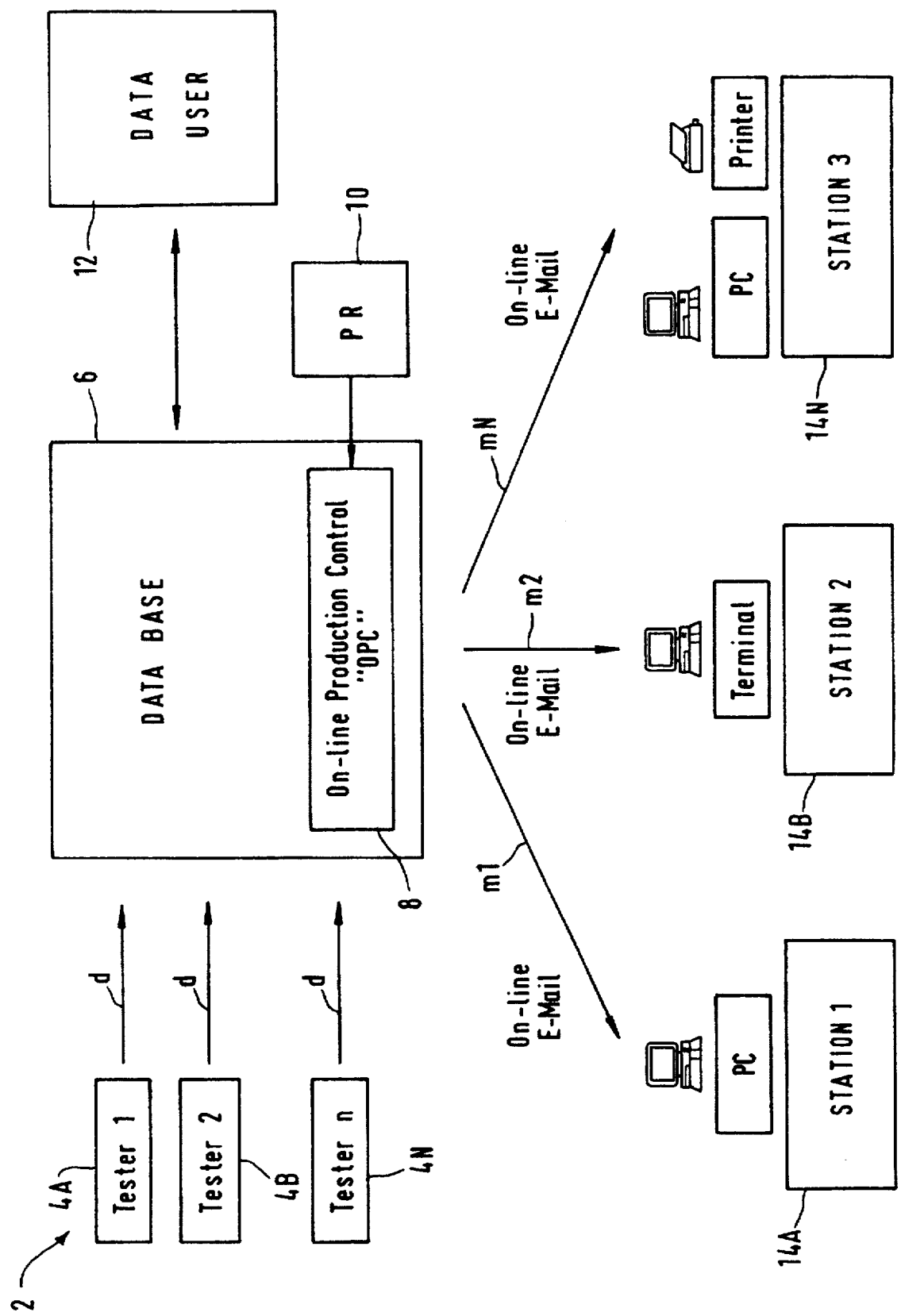

INFORMATION SYSTEM FOR PRODUCTION CONTROL

BACKGROUND OF THE INVENTION

1. Field of the Invention

The present invention relates generally to information systems and more particularly, to an information system that can provide improved production control in the area of semiconductor fabrication.

2. Description of the Prior Art

Information systems are commonly utilized to provide production control functions such as to retrieve production figures of individual products or entire product ranges, compile statistics, calculate costs, determine yields, and the like. Such information systems are known, and have become nearly indispensable in various lines of production. These systems are especially useful in lines of production that require fast analysis and feedback of the test information, and where test conditions are critical and relatively wide process variations occur.

Information systems are especially useful in the area of semiconductor fabrication. Semiconductor fabrication requires a great number of successive process steps which result in a relatively high failure rate, so that any yield improvement is of considerable importance. A frequent source of error in semiconductor fabrication occurs at the final test of the devices. This error can be caused by faulty devices, but is often caused either by a faulty tester or by not testing the right device. A further source of error is associated with wafer probe testing. Wafer probe testing is accomplished by means of very fine needles which are placed on minute contact areas of the semiconductor chip. Varying thickness of the wafers and a number of other causes frequently lead to contact problems, which must be detected quickly to prevent properly functioning devices from being rejected.

A problem with present semiconductor fabrication systems is that the emphasis is placed on the individual device and conformity to electronic specifications. This often can lead to production problems because as discussed above the problems are often related to the test environment and the various production steps. A further problem is that the present systems lack the flexibility to relay the information relating to production problems where it is needed the most.

Therefore it is an object of the present invention, to provide a more flexible information system for providing improved production control in the area of semiconductor fabrication which emphasizes the problems related to the test environment and the various production steps.

SUMMARY OF THE INVENTION

An information system for providing improved production control in the area of semiconductor fabrication. The system includes testers that generate data relating to semiconductor fabrication. The system further includes a database which receives and stores the data. Means for analyzing the data is provided, including test profiles associated with the different devices to be tested. The test profiles include a predetermined limit for generating an electronic message in response to the data exceeding the predetermined limit. Receiving stations are further included which are each associated with at least one test profile for automatically receiving the error message generated. The error message received by the receiving stations are utilized to initiate a check in test procedures, work procedures or processes.

BRIEF DESCRIPTION OF THE DRAWINGS

The above objects, further features and advantages of the present invention are described in detail below in conjunction with the drawings, of which:

The sole FIGURE is a block diagram of the information system according to the present invention.

DETAILED DESCRIPTION OF THE DRAWINGS

Referring to the sole FIGURE, there is shown a block diagram of the information system according to the present invention designated by numeral 2. The information system 2 is configured to provide production control in the area of semiconductor fabrication. The information system 2 provides enhanced production control functions which include, but are not limited to reducing the cycle time and increasing the yields of the semiconductor fabrication processes. Reduced cycle times are achieved by enabling fast analysis and feedback of test data. While increased yields are achieved by initiating messages in response to measured data, which are transferred as quickly and precisely as possible to responsible quarters, so that appropriate measures can be taken without delay. This is also advantageous if defects are not obvious, but more or less hidden, because further analysis can then be quickly initiated by an expert to find a remedy.

The system 2 includes a plurality of testers 4A, 4B ... 4N. The testers 4A, 4B ... 4N are any test facilities that are utilized in the fabrication of semiconductor devices. The testers 4A, 4B ... 4N generate product-specific or fabrication-specific data d, which is formatted into data files that are compatible with the rest of the system 2. The type of data d includes but is not limited to tester name, date of test, time of test, yield failing test number and lot and sub-lot identification.

Coupled to the testers 4A, 4B ... 4N is a data base 6 for collecting and conditioning the data d in the usual manner, so that information about individual products, production lots, production runs, or entire product families etc. is available. The data d stored in the data base 6 is retrievable or is automatically passed on to at least one arbitrary data user 12. The data user 12 preferably is embodied by a terminal or personal computer.

The system 2 further includes an on line production control or analyzing facility 8, which preferably is contained within the database 6. The analyzing facility is for analyzing the data d stored in the database 6 by means of a plurality of test profiles. The test profiles are installed by means of a programming device 10. These test profiles differ from commonly used test procedures in that they concentrate not so much on the individual device and on conformity to electronic specifications, but rather on the test environment and the various production steps.

The test profiles are configured to include predetermined limits relating to the data d stored in the database 6. The test profiles are configured to each generate an electronic message m1, m2 ... mN in response to the data d exceeding the predetermined limits. Each of the test profiles are assigned to one of the Receiving stations 14A, 14B ... 14N, which enables the electronic message m1, m2 ... mN to be automatically sent to one of the receiving stations 14A, 14B ... 14N, which is either a terminal or personal computer.

Each of the Receiving stations 14A, 14B ... 14N have an associated defined department and people that respond to the electronic message m1, m2 ... mN received. Such responses include checking on the respective test procedure, working processor, or process in the current and/or subsequent production runs.

The electronic messages m1, m2 ... mN are sent to the receiving stations 14A, 14B ... 14N via a two-way data link. The two way data link preferably is an electronic-mail system, which is highly flexible and, as a rule, already present for other purposes. Such properties make electronic-mail systems efficient when utilized in an information system 2 according to the present invention. Such an electronic-mail system is, for example, "cc:Mail for Windows" from "Lotus" (both names registered as trademarks), but other electronic-mail systems are also available or can be purchased for use in conventional data networks with attached stations.

The following is a more detailed discussion of the information system 2 during operation according to the present invention. A frequent source of error in semiconductor fabrication relates to problems at final test. For example, if it is determined that a final tester 4A is measuring only defective devices, it is highly probable that either the final tester 4A is faulty or wrong devices are being tested. A suitable test profile can provide a corresponding message m1 to the receiving station 14A in the final test department to activate the supervising person. On the other hand, the message m1 can also activate the respective tester directly in order to change the measuring procedure therein. By means of this new data, the analyzing facility 8 further isolates the defect and more specifically indicates the defect to the final test department.

Another, frequent source of error in semiconductor device manufacturing is specifically associated with wafer-probe testing. This test is made by means of very fine needles which are placed on minute contact areas of the semiconductor chip. Varying thickness of the wafers and a number of other causes frequently lead to contact problems, which must be detected quickly to prevent properly functioning devices from being rejected.

During probing or final testing, however, other defects may also be detected which only appear as systematic deviations from predetermined ranges of values but still lie within tolerance limits and indicate that one of the fabrication processes has left the desired range. In that case it is extremely important to quickly send a message m2 to the receiving station 14B of the appropriate preliminary or intermediate test department, indicating the suspected weak spot if possible, so that a check can be made to ensure that subsequent lots will be processed correctly. Here, the test profile includes, for example, the measurement of turnover voltages, pulse times, current gains, power consumption, resistance values, etc.

Finally there are similar test profiles which, through the selection of the individual measurements, show in particular that the measurement limits are unnecessarily narrow or cannot correctly determine particular causes of failures. In that case, the defects are more likely to be hidden defects, such as contact failures or a failure of a tester, which cannot readily be removed by an operator. Such hidden defects are signalled via a third message mN to a third receiving station 14N, mainly an engineering department, which must then analyze and, if necessary, modify the test programs. The message mN further contains information indicating the respective priority.

Since the engineering department is capable of accessing the data base 6 as a data user 12, it can retrieve further information from the data base 6 to receive a clearer picture of the steps to be taken. In the engineering department, the advantage of the electronic-mail system becomes particularly clear through the selective message mN. As a rule, this department is relatively far away from the test facilities proper and, in addition, is not directly concerned with the current testing operations. It is therefore important that the responsible person can be reached with certainty and quickly.

Known electronic-mail systems provide this capability in the best possible way via there specific instructions and characteristics, such as addressing, address diversion, address transfer, group addressing, and the like. The contents of the respective messages m1, m2 ... mN can be freely chosen, so that the messages may contain bare information, but also instructions for data-processing or control equipment.

While the invention has been particularly shown and described with reference to preferred embodiments thereof, it will be understood by those skilled in the art that changes in form and details may be made therein without departing from the spirit and scope of the present invention.

What is claimed is:

1. An information system for providing improved production control in the area of semiconductor fabrication, comprising:

a plurality of testers for generating data relative to semiconductor fabrication;

a database for receiving and storing said data;

means for analyzing said data including test profiles associated with the different devices to be tested, each of said profiles having a predetermined limit for generating an error message in response to said data exceeding said predetermined limit, wherein each said test profile is assigned to a receiving station; and a plurality of said receiving stations, each said receiving station associated with one of said test profiles for automatically receiving said error message generated by one of said test profiles, wherein receipt of said error message from said assigned test profile initiates a check on a semiconductor fabrication procedure.

2. The system of claim 1, wherein the data is selected from the group consisting of product-specific data or fabrication-specific data.

3. The system of claim 1, which further comprises a means for accessing said database.

4. The system of claim 1, which further comprises a means for installing said test profiles.

5. The system of claim 1, wherein each of said test profiles are programmable.

6. The system of claim 1, wherein each of said receiving stations is coupled to said analyzing facility by a two-way data link.

7. The system of claim 1, wherein said two way data link is an electronic-mail system.

8. The system of claim 1, wherein a first said error message from one of said plurality of test profiles assigned to one of said plurality of receiver stations sent to a first said receiving station initiates a check in a final test department.

9. The system of claim 1, wherein a second said error message from one of said plurality of test profiles assigned to one of said plurality of receiver stations sent to a second said receiving station initiates a check in a department selected from the group consisting of a preliminary test department, an intermediate test department and a production department.

10. The system of claim 1, wherein a third said error message from one of said plurality of test profiles assigned to one of said plurality of receiver stations sent to a third said receiving station initiates a check in a engineering department responsible for creating the individual test programs and test profiles.

11. An information system for providing improved production control in the area of semiconductor fabrication, comprising:

at least one tester for generating data relative to semiconductor fabrication;

a database for receiving and storing said data;

means for analyzing said data including test profiles associated to the different devices to be tested, each of said profiles having predetermined limits for generating at least one error message in response to said data exceeding said predetermined limits, wherein said test profile is assigned to a receiving station; and a plurality of said receiving stations, at least one of said plurality of receiving stations remotely located, each said receiving station associated with at least one of said test profiles for automatically receiving said error message generated from one of said test profiles, wherein receipt of said error message from said assigned test profile initiates a check on a semiconductor fabrication procedure, wherein said plurality of receiving stations are coupled to said analyzing means by a two way data link comprising an electronic mail system, wherein each said error message generated in response to said data exceeding said predetermined limits is transmitted over said data link.

12. The system of claim 11, wherein the data is related to semiconductor fabrication and is selected from the group consisting of product-specific data or fabrication-specific data.

13. The system of claim 11, which further comprises a means for accessing said database.

14. The system of claim 11, which further comprises a means for installing said test profiles.

15. The system of claim 11, wherein said test profiles are programmable.

16. The system of claim 11, wherein said plurality of receiving stations includes a first receiving station, wherein a first said error message sent to said first receiving station initiates a check in a final test department.

17. The system of claim 11, wherein said plurality of receiving stations includes a second receiving station, wherein a second said error message sent to said second receiving station initiates a check in a department selected from the group consisting of a preliminary test department, an intermediate test department and a production department.

18. The system of claim 11, wherein said plurality of receiving stations includes a third receiving station, wherein a third said error message sent to said third receiving station initiates a check in an engineering department responsible for creating individual test programs and test profiles.

* * * * *